United States Patent
Ohno et al.

(10) Patent No.: US 9,957,638 B2
(45) Date of Patent: May 1, 2018

(54) METHOD FOR MANUFACTURING SILICON CARBIDE SEMICONDUCTOR DEVICE

(71) Applicant: Mitsubishi Electric Corporation, Tokyo (JP)

(72) Inventors: Akihito Ohno, Tokyo (JP); Yoichiro Mitani, Tokyo (JP); Takahiro Yamamoto, Tokyo (JP); Nobuyuki Tomita, Tokyo (JP); Kenichi Hamano, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 127 days.

(21) Appl. No.: 14/584,076

(22) Filed: Dec. 29, 2014

(65) Prior Publication Data
US 2015/0267320 A1    Sep. 24, 2015

(30) Foreign Application Priority Data
Mar. 24, 2014   (JP) ................... 2014-059990

(51) Int. Cl.
 C30B 25/18    (2006.01)
 C30B 29/36    (2006.01)
 H01L 21/02    (2006.01)

(52) U.S. Cl.
 CPC ............ *C30B 25/186* (2013.01); *C30B 29/36* (2013.01); *H01L 21/0243* (2013.01);
 (Continued)

(58) Field of Classification Search
 CPC combination set(s) only.
 See application file for complete search history.

(56) References Cited

U.S. PATENT DOCUMENTS

2001/0046757 A1* 11/2001 Takahashi ............. H01L 21/046
                                                          438/518
2006/0267024 A1* 11/2006 Murphy ............. H01L 21/26506
                                                          257/77
(Continued)

FOREIGN PATENT DOCUMENTS

CN       102576666 A    7/2012
JP       2001-077030 A  3/2001
(Continued)

OTHER PUBLICATIONS

An Office Action issued by the Korean Patent Office dated Jul. 14, 2016, which corresponds to Korean Patent Application No. 10-2015-0034734 and is related to U.S. Appl. No. 14/584,076; with English language partial translation.
(Continued)

*Primary Examiner* — Duy Vu N Deo
*Assistant Examiner* — Erin F Bergner
(74) *Attorney, Agent, or Firm* — Studebaker & Brackett PC

(57) ABSTRACT

A method for manufacturing a silicon carbide semiconductor device includes: preparing a silicon carbide single crystal substrate having a flatness with an average roughness of 0.2 nm or less; gas-etching a surface of the silicon carbide single crystal substrate under an atmosphere of a reducing gas; and forming a silicon carbide layer on the gas-etched surface of the silicon carbide single crystal substrate, wherein an etching rate of the gas etching is made in a range of 0.5 μm/hour or faster to 2.0 μm/hour or slower.

4 Claims, 5 Drawing Sheets

(52) U.S. Cl.
CPC .... *H01L 21/0262* (2013.01); *H01L 21/02378* (2013.01); *H01L 21/02428* (2013.01); *H01L 21/02529* (2013.01); *H01L 21/02576* (2013.01); *H01L 21/02598* (2013.01); *H01L 21/02658* (2013.01)

(56) References Cited

U.S. PATENT DOCUMENTS

| | | |
|---|---|---|
| 2007/0290211 A1 | 12/2007 | Nakayama et al. |
| 2012/0146056 A1 | 6/2012 | Momose et al. |
| 2012/0280254 A1 | 11/2012 | Muto et al. |
| 2013/0126906 A1 | 5/2013 | Tomita et al. |
| 2015/0144964 A1* | 5/2015 | Kang ................ H01L 21/02529 257/77 |

FOREIGN PATENT DOCUMENTS

| | | |
|---|---|---|
| JP | 2004-075493 A | 3/2004 |
| JP | 2005-109342 A | 4/2005 |
| JP | 2008-4888 A | 1/2008 |
| JP | 2010-111540 A | 5/2010 |
| JP | 2011-49496 A | 3/2011 |
| JP | 2013-170104 A | 9/2013 |
| JP | 5598542 B2 | 10/2014 |
| KR | 2012-0046282 A | 5/2012 |
| WO | WO/2013/180483 | * 12/2013 ............ H01L 21/20 |

OTHER PUBLICATIONS

An Office Action issued by the German Patent Office dated Apr. 7, 2017, which corresponds to German Patent Application No. 102015202131.9 and is related to U.S. Appl. No. 14/584,076; with English language partial translation.

An Office Action issued by the Japanese Patent Office on Jun. 20, 2017, which corresponds to Japanese Patent Application No. 2014-059990 and is related to U.S. Appl. No. 14/584,076; with English language partial a translation.

An Office Action issued by the Chinese Patent Office on Apr. 1, 2017, which corresponds to Chinese Patent Application No. 201510131777.6 and is related to U.S. Appl. No. 14/584,076; with English language partial translation.

Mitani, Yoichiro et al., "Demonstration of high quality 4H-SiC epitaxy by using the two-step growth method", Material Science Forum vols. 778-780, (2014), pp. 167-170.

An Office Action, "Decision of Refusal", issued by the Japanese Patent Office dated Dec. 5, 2017, which corresponds to Japanese Patent Application No. 2014-059990 and is related to U.S. Appl. No. 14/584,076; with English translation.

* cited by examiner

METHOD FOR MANUFACTURING SILICON CARBIDE SEMICONDUCTOR DEVICE

BACKGROUND OF THE INVENTION

Field of the Invention

The present invention relates to a method for manufacturing a silicon carbide semiconductor device in which an epitaxial growth layer is formed after gas etching of surface of a silicon carbide single crystal substrate.

Background Art

In recent years, silicon carbide (SiC), which has relatively larger band gap, breakdown field strength, saturated drift velocity, and heat conductivity as compared with silicon, is receiving attention as the power device material for power control. In fact, a power device using this silicon carbide (silicon carbide semiconductor device) can significantly reduce power loss and contribute to downsizing, whereby realizing an energy save during change of a power source; and as a result, this becomes a key device for a low carbon society in which an electric vehicle with higher performance, a more highly functionalized solar system, and the like can be realized.

In production of a silicon carbide semiconductor device, generally, a silicon carbide layer which will become an active region of the silicon carbide semiconductor device is heated in advance for epitaxial growth by means of a thermal CVD method (thermochemical gas phase deposition method) or the like on a silicon carbide single crystal substrate (SiC bulk single crystal substrate). Here, the active region means a cross section region which includes the axis of the growth direction wherein the layer thickness and the doping density in the crystal are precisely controlled. The reason to require not only the silicon carbide single crystal substrate but also the silicon carbide layer like this is because the doping density and the layer thickness are fixed in accordance with the device specification, so that a higher accuracy than that of the bulk singe crystal substrate is wanted.

Hereinafter, the wafer having the silicon carbide layer epitaxially grown on the silicon carbide single crystal substrate is called as an epitaxial wafer. The silicon carbide semiconductor device is manufactured by processing this epitaxial wafer with various treatments. Accordingly, the device yield which is the ratio of the number of the obtained device having an intended properties from one epitaxial wafer is highly dependent on uniformity of electric properties of the epitaxial growth layer. If there is a local region in which the breakdown field strength in the epitaxial wafer surface is smaller than other region, or if there is a local region in which relatively large electricity flows upon application of a certain voltage, device characteristics including the said region, such as for example, the voltage resistance characteristics may be deteriorated. Therefore, even when a relatively smaller voltage is applied, there occurs a problem of the flow of a so-called leak electricity. In other words, the factor to primarily determine the device yield resides in crystallographic uniformity of the epitaxial wafer. As the factor to impair this uniformity, it is known that there are various so-called current leakage defects caused by a problem during the epitaxial growth.

The common feature among the above-mentioned crystal defects resides in that periodicity of atomic array in the crystal is locally imperfect in the direction of the crystal growth. As to the defect caused by the epitaxial growth of the silicon carbide, the current leakage defect that is called as a carrot defect, a triangle defect, and so forth from the feature of its surface form is known. Among them the factor from which the triangle defect is caused includes, besides a different kind of a polytype crystal nucleus and a scar which is caused by polishing and is remained on the substrate surface, a SiC dust which is attached on the substrate surface. This SiC dust is attached during the time when the silicon carbide single crystal substrate is produced, namely this includes the dust that is attached during processing the silicon carbide single crystal substrate by means of carving, polishing, and so forth after growth of the SiC bulk single crystal and the dust that is released from the silicon carbide layer which is deposited inside the reaction furnace during the epitaxial growth on the silicon carbide single crystal substrate by means of the thermal CVD method.

Meanwhile, a technology to flatten the substrate surface by means of hydrogen etching of the silicon carbide single crystal substrate has been proposed (for example, see Japanese Patent Laid-Open Publication No. 2001-77030). However, this did not suppose the case to flatten the silicon carbide single crystal substrate having the flatness with the average roughness of 0.2 nm or less.

SUMMARY OF THE INVENTION

In the silicon carbide semiconductor device manufactured by using the silicon carbide layer which has these triangle defects formed therein, the yield and the device characteristics including the voltage resistance characteristics are deteriorated. Therefore, there has been a problem of deteriorated reliability of the products obtained therefrom.

The present invention was made to solve the problem as mentioned above; and thus, the present invention has an object to provide a method for manufacturing a silicon carbide semiconductor device which can improve the reliability of the product thereof.

According to the present invention, a method for manufacturing a silicon carbide semiconductor device includes: preparing a silicon carbide single crystal substrate having a flatness with an average roughness of 0.2 nm or less; gas-etching a surface of the silicon carbide single crystal substrate under an atmosphere of a reducing gas; and forming a silicon carbide layer on the gas-etched surface of the silicon carbide single crystal substrate, wherein an etching rate of the gas etching is made in a range of 0.5 µm/hour or faster to 2.0 µm/hour or slower.

In the present invention, surface of the silicon carbide single crystal substrate having the flatness of 0.2 nm or less as the average roughness is gas-etched at the etching rate in the range of 0.5 µm/hour or faster to 2.0 µm/hour or slower under the reducing gas atmosphere, then the silicon carbide layer is grown epitaxially. By so doing, the high quality silicon carbide layer having less crystal defects can be obtained. Accordingly, the yield and the device characteristics including the voltage-resistance characteristics can be improved, so that reliability of the product thereof can be improved.

Other and further objects, features and advantages of the invention will appear more fully from the following description.

DETAILED DESCRIPTION OF THE PREFERRED EMBODIMENTS

Figure 1:
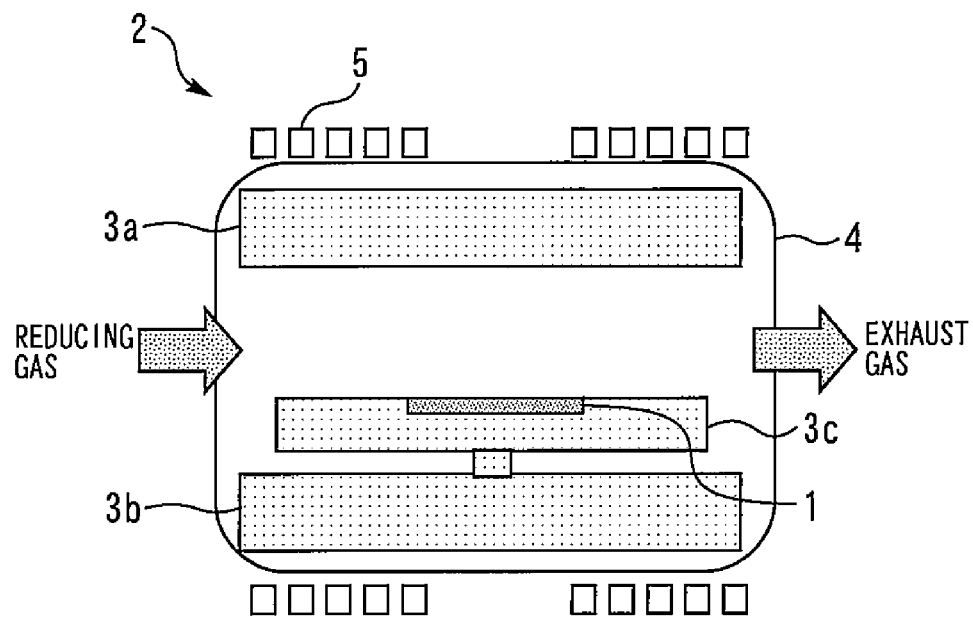
FIG. 1 and FIG. 2 are the drawings to explain the method for manufacturing a silicon carbide semiconductor device according to an embodiment of the present invention.
Figure 2:
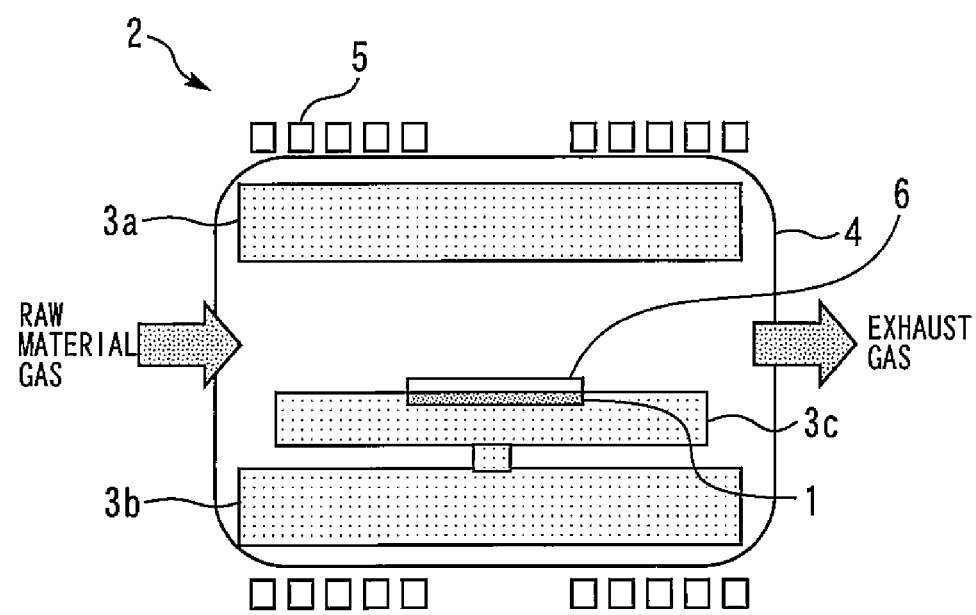

FIG. 1 and FIG. 2 are the drawings to explain the method for manufacturing a silicon carbide semiconductor device according to an embodiment of the present invention. Firstly, the silicon carbide single crystal substrate 1 having the flatness with the average roughness of 0.2 nm or less is prepared. Specifically, at first, the 4H—SiC bulk single crystal substrate having the off-angle of 4 degrees in the direction of <11-20> toward the main surface (0001) (C) is processed with the planarization treatment by a mechanical polish and a chemical mechanical polish using an acidic or a basic chemical. Next, an organic substance is removed by the ultrasonic washing treatment with acetone. Then, so-called RCA cleaning is carried out. Namely, this substrate is immersed in a mixed solution of an aqueous ammonia and an aqueous hydrogen peroxide (1:9) heated at 75° C. (±5° C.) for 10 minutes, and then in a mixed solution of hydrochloric acid and an aqueous hydrogen peroxide (1:9) heated at 75° C. (±5° C.). Thereafter, it is immersed in an aqueous solution of about 5% by volume of hydrogen fluoride, and then surface of the substrate is cleaned by displacing the solution with pure water. By the processes shown above, the silicon carbide single crystal substrate 1 is formed. Here, the average roughness is the calculated average roughness Ra obtained by the value calculated from the measurement of the surface area of a square with 5 μm×5 μm in the silicon carbide single crystal substrate 1 with the atomic force microscope (AFM).

Meanwhile, the off-angle of the silicon carbide single crystal substrate 1 is not restricted to 4 degrees; and thus, the off-angle may be in the range of about 2 to about 10 degrees. It may be sufficient if the planarization treatment thereof is made to the average roughness of 0.2 nm or less by a chemical mechanical polish, or it may be more preferable if there is no scratch by surface observation with the differential interference contrast microscope.

FIG. 1 shows the configuration diagram of the reaction furnace 2 of the CVD apparatus in this embodiment. The reaction furnace 2 is of a horizontal hot wall type which is provided with the susceptor upper part 3a, the susceptor lower part 3b, and the susceptor stage 3c, these being formed of SiC-coated high purity graphite. On this susceptor stage 3c, the silicon carbide single crystal substrate 1 is placed. Then, a reducing gas, such as for example a hydrogen gas, is introduced into the reaction furnace 2. This hydrogen gas plays a role also as a carrier gas. Then, the pressure is regulated such that the evacuation degree inside the reaction furnace 2 may be kept constant, such as for example around at 5 kPa. Then, an alternating current is introduced into the induction coil 5 that is looped around the quartz tube 4 thereby causing the induction overheat to heat the susceptor upper part 3a, the susceptor lower part 3b, and the susceptor stage 3c to the temperature of about 1650° C., whereby annealing is carried out under the atmosphere of a reducing gas. By so doing, the surface of the silicon carbide single crystal substrate 1 is gas-etched under the atmosphere of a reducing gas. During this operation, the atmosphere of a reducing gas comprises only a hydrogen gas. For example, the etching rate of the substrate surface is 1.0 μm/hour, and the annealing time is 15 minutes.

Then, as shown in FIG. 2, by charging a raw material gas into the reaction furnace 2, the silicon carbide layer 6 with the thickness of 10 μm is epitaxially grown on surface of the silicon carbide single crystal substrate 1. For example, a silane gas ($SiH_4$) is charged at the flow rate of 500 sccm as the source of silicon atom, and a propane gas ($C_3H_8$) at the flow rate of 200 sccm as the source of carbon atom. A nitrogen gas is used as the N-type doping. The nitrogen gas was charged as the N-type doping in such a way that the carrier concentration might become $1×10^{17}/cm^3$ on the substrate interface and $8×10^{15}/cm^3$ in the active region.

Thereafter, charge of the raw material gas is terminated, and the temperature is descended to room temperature. The number of the triangle defects on this epitaxial wafer was measured by a surface checking instrument of the confocal optical scanning microscope (for example, by means of SICA6X manufactured by Lasertec Corp.), showing that the defect density was $0.06/cm^2$, namely, it was extremely low. By forming a device on this substrate, the silicon carbide single crystal substrate with high quality can be obtained in high yield.

By so doing, inventors of the present invention found that annealing under the atmosphere of a reducing gas, which was carried out before formation of the silicon carbide layer 6, was important to reduce the triangle defect. In addition, it was found that by appropriately controlling the etching rate of the substrate surface during annealing, the epitaxial wafer having extremely low defect density could be obtained. The etching rate of the substrate surface is mainly controlled by the temperature of the substrate surface and the pressure in the reaction furnace; and the etching takes place in accordance with the following equation of the reducing reaction.

$$2SiC + H_2 \rightarrow 2Si + C_2H_2 \qquad \text{(Equation 1)}$$

Figure 3:
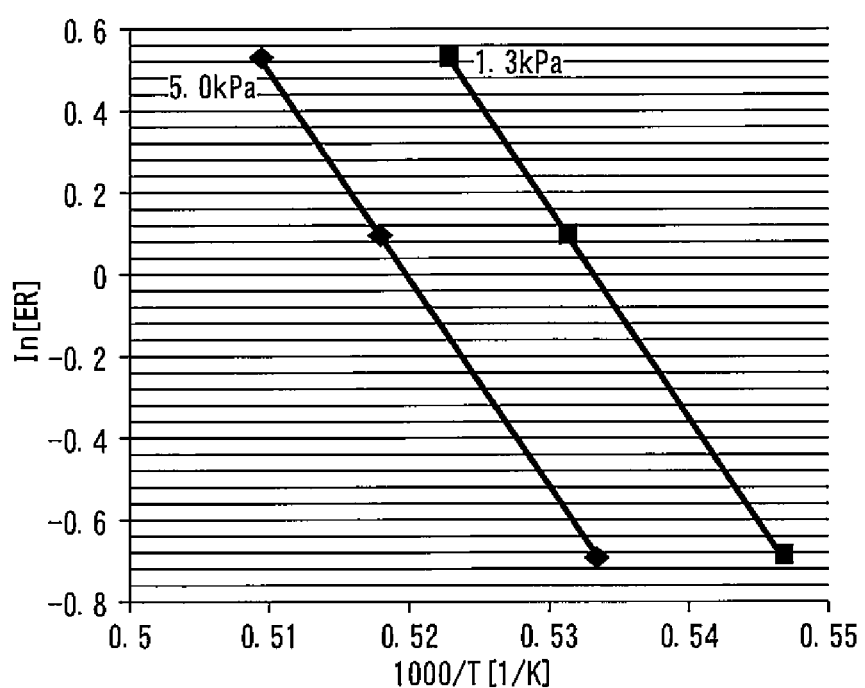
FIG. 3 illustrates the Arrhenius plots of the etching rate against the set temperature.

The etching rate increases exponentially in accordance with the Arrhenius equation by raising the temperature of the substrate surface, namely by raising the set temperatures of the susceptor upper part 3a, the susceptor lower part 3b, and the susceptor stage 3c inside the reaction furnace 2. FIG. 3 illustrates the Arrhenius plots of the etching rate against the set temperature. By setting the set temperature of the reaction furnace 2, the etching rate can be changed appropriately. The etching rate changes also by the pressure of the reaction furnace, so that the etching may be facilitated by lowering the pressure because by so doing the sublimation pressure can be lowered, too. As shown in FIG. 3, by changing the pressure inside the reaction furnace 2, similarly to the set temperature the etching rate can be changed.

Figure 4:
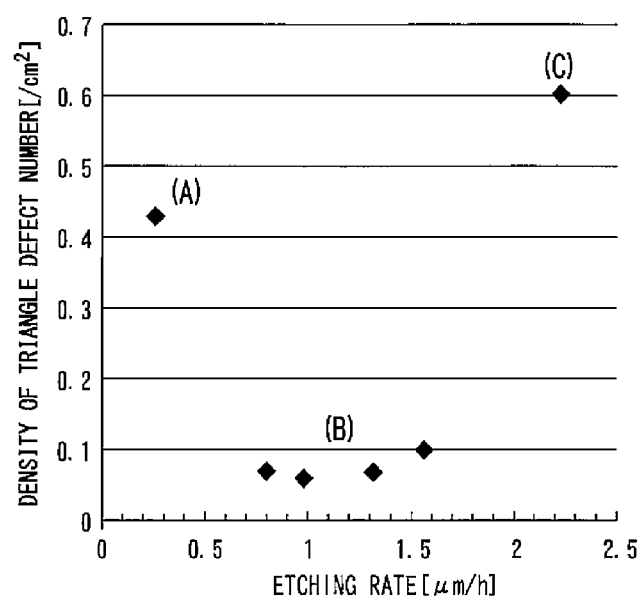
FIG. 4 illustrates the relationship between the etching rate and the density of the triangle defect number.
Figure 5:
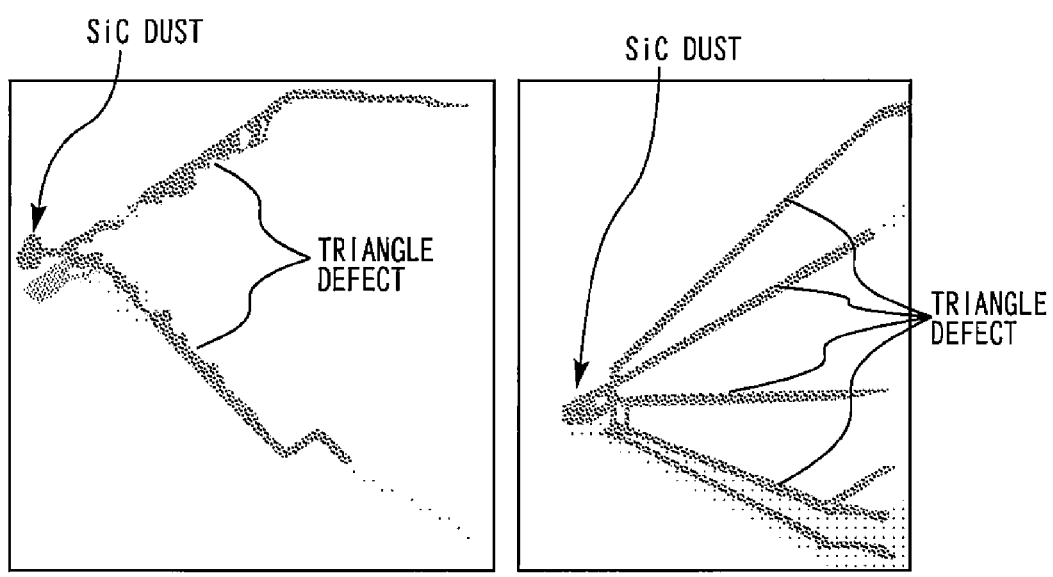
FIG. 5 illustrates examples of the triangle defect started from the SiC dust.

As mentioned above, the experiment of the epitaxial growth was repeated extensively by changing the etching rate of the SiC substrate surface in the annealing process under the reducing gas atmosphere; and as a result, it was found that there was a special relationship between the etching rate and the density of the triangle defect number. FIG. 4 illustrates the relationship between the etching rate and the density of the triangle defect number. FIG. 5 illustrates examples of the triangle defect started from the SiC dust. It was found that if the etching rate was slower than 0.5 μm/hour, many triangle defects started from the SiC dust as shown in FIG. 5 were observed. On the other hand, it was found that when the etching rate was made 0.5 μm/hour or faster, the triangle defect density became $0.1/cm^2$ or less, namely, the triangle defect density was extremely low.

Figure 6:
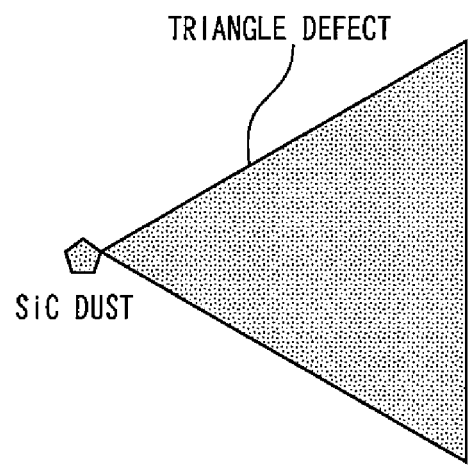
FIG. 6 and FIG. 7 show respectively the top view and the cross section view of the triangle defect started from the SiC dust.
Figure 7:
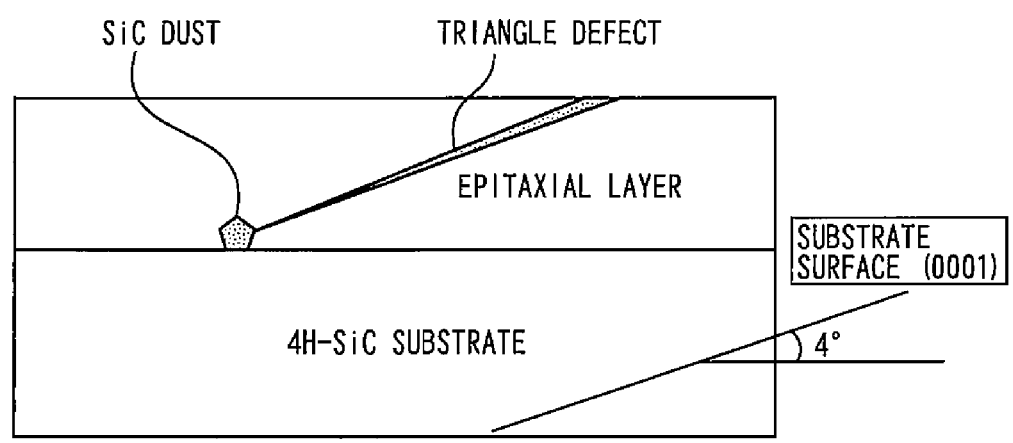

FIG. 6 and FIG. 7 show respectively the top view and the cross section view of the triangle defect started from the SiC dust. The triangle defect grows, with the step-flow growth, starting from the SiC dust attached to the substrate, or from the SiC dust dropped onto the substrate surface before the epitaxial growth. That is, it grows in the shape of triangle from the SiC dust as the apex thereof while increasing its area with keeping the symmetrical shape thereof; and thus, the size of the triangle is larger when the triangle is formed earlier as well as thickness of the epitaxial growth is thicker. In order to prevent generation of the triangle defect like this from occurring, it is essential to remove the SiC dust before the epitaxial growth starts. Here, it is thought that when the etching rate was slow, the silicon carbide layer 6 was formed without removing the SiC dust attached to the substrate surface by etching during annealing process, whereas when the etching rate was made to 0.5 µm/hour or faster, the SiC dust could be effectively removed before the silicon carbide layer 6 started to be formed.

On the other hand, it was found that when the etching rate was made to 2.2 µm/hour, the density of the triangle defect was rapidly increased to 0.6/cm$^2$. It is thought that this was caused because if the etching rate was too fast, release of the silicon carbide layer which was accumulated on the susceptor upper part 3a, the susceptor lower part 3b, and the susceptor stage 3c was facilitated, especially the dropping amount of the SiC dust accumulated on the susceptor upper part 3a onto the substrate was increased. Further, it is thought that because nuclei of abnormal growth were formed by the Si droplets on the substrate surface due to excessive release of Si as shown in Equation 1, the number of the starting points of the triangle defect was increased. Moreover, it became apparent experimentally that when the etching rate was as fast as 2.2 µm/hour, even if the etching time was cut to about half so that the etching amount might become the same as that under the condition of the etching rate of 1.0 µm/hour, at which rate the defect density was low, the triangle defect was generated similarly, with the density thereof being as high as 0.5/cm$^2$. This shows that mere control of the etching amount of the substrate surface cannot suppress the density of the triangle defect to a low level. Accordingly, the etching rate of the gas etching needs to be made in the range of 0.5 µm/hour or faster to 2.0 µm/hour or slower.

In this embodiment, surface of the silicon carbide single crystal substrate 1 having the flatness of 0.2 nm or less as the average roughness is gas-etched at the etching rate in the range of 0.5 µm/hour or faster to 2.0 µm/hour or slower under the reducing gas atmosphere, then the silicon carbide layer 6 is grown epitaxially. By so doing, the high quality silicon carbide layer 6 having less crystal defects can be obtained. Accordingly, the yield and the device characteristics including the voltage-resistance characteristics can be improved, so that reliability of the product thereof can be improved.

Meanwhile, during the time of formation of the silicon carbide layer 6, an organometallic material containing Al, B, and Be may be charged as the P-type doping material, if necessary. In addition, in order to facilitate the growth rate, a gas which contains chlorine may be used concurrently.

Further, the growth rate of the silicon carbide layer 6 can be changed by arbitrarily changing the flow rate of the raw material gas, and the same effect can be obtained at the growth rate of 1 µm/hour and at the growth rate of 10 µm/hour.

In this embodiment, the annealing time was set at 15 minutes in the gas etching; however, if the annealing time is longer than one hour, the step bunching started from the spiral pit tends to occur readily. The spiral pit is a mortar-like depression formed by the etching in the screw dislocation portion that is present in the silicon carbide single crystal substrate 1. During annealing, the step bunching is generated from the spiral pit as the starting point thereof in the process of reconstruction of the surface atoms on the silicon carbide single crystal substrate 1. This step bunching lingers its morphology in the process of forming the silicon carbide layer 6, so that it may deteriorate the flatness of the substrate surface after formation of the layer. Accordingly, the time of the gas etching is preferably within one hour; however, when considering the productivity collectively, the time is more preferably within 30 minutes. However, the optimum etching rate and annealing time are dependent on the situation how the layer formation is made in the reaction furnace 2. Accordingly, these conditions cannot be unambiguously determined; and thus, it is thought that these conditions are dependent on configuration, structure, and the like inside the furnace of the CVD apparatus. Therefore, the preferable conditions are determined in accordance with the specific cases.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-059990, filed on Mar. 24, 2014 including specification, claims, drawings and summary, on which the Convention priority of the present application is based, is incorporated herein by reference in its entirety.

What is claimed is:

1. A method for manufacturing a silicon carbide semiconductor device comprising:
    preparing a silicon carbide single crystal substrate having a flatness with an average roughness of 0.2 nm or less;
    gas-etching a surface of the silicon carbide single crystal substrate under an atmosphere of a reducing gas; and
    forming a silicon carbide layer on the gas-etched surface of the silicon carbide single crystal substrate,
    wherein an etching rate of the gas etching is made in a range of 0.5 µm/hour or faster to 2.0 µm/hour or slower, such that said etching rate reduces the occurrence of triangle defects, and the silicon carbide layer has a triangle defect density of 0.1/cm$^2$ or less.

2. The method according to claim 1, wherein the reducing gas is a hydrogen gas.

3. The method according to claim 1, wherein a time of the gas etching is within one hour.

4. The method according to claim 1, wherein said gas-etching atmosphere has a pressure of less than 10 kPa.

* * * * *